(12) United States Patent
Krainak

(10) Patent No.: US 10,775,679 B1
(45) Date of Patent: Sep. 15, 2020

(54) COHERENT OPTICAL TRANSISTOR

(71) Applicant: United States of America as represented by the Administrator of NASA, Washington, DC (US)

(72) Inventor: Michael A. Krainak, Fulton, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 149 days.

(21) Appl. No.: 16/109,472

(22) Filed: Aug. 22, 2018

(51) Int. Cl.
*G02F 3/02* (2006.01)
*H01S 5/065* (2006.01)
*G02B 5/18* (2006.01)

(52) U.S. Cl.
CPC .......... *G02F 3/026* (2013.01); *G02B 5/1809* (2013.01); *G02B 5/1814* (2013.01); *G02B 5/1857* (2013.01); *H01S 5/0657* (2013.01); *G02F 2201/06* (2013.01); *G02F 2201/30* (2013.01); *G02F 2203/13* (2013.01)

(58) Field of Classification Search
CPC ... G03F 3/00; G03F 3/02; G03F 3/024; G03F 3/028
See application file for complete search history.

(56) References Cited

PUBLICATIONS

Tobias Birr et al., "Ultrafast surface plasmon-polariton logic gates and half adder," Optical Society of America, 2015, vol. 23, No. 25, pp. 31755-31765.

Xu Fang et al., "Controlling light with light using coherent metadevices: all-optical transistor, summator and invertor", Light: Science & Applications, 2015, pp. 1-7.

M. Belic et al., "Photorefractive circuitry and optical transistors", Optics Communications, 1996, pp. 657-664.

Prateeksha Sharma et al., "All Optical Logic Gates Using Hybrid Metal Insulator Metal Plasmonic Waveguide", IEEE Photonics Technology Letters, vol. 30, No. 10, 2018, pp. 959-962.

Yuhei Ishizaka et al., "Design of ultra compact all-optical XOR and AND logic gates with low power consumption", Optics Communication, 2011, pp. 3528-3533.

Hussein M.E. Hussein et al, "A review on the techniques for building all-optical photonic crystal logic gates", Optics and Laser Technology, 2018, pp. 385-397.

Yulan Fu et al., "Silicon photonic crystal all-optical logic gates", Physics Letters A, 2013, pp. 329-333.

(Continued)

*Primary Examiner* — Robert E. Tallman
(74) *Attorney, Agent, or Firm* — Christopher O. Edwards; Bryan A. Geurts; Helen M. Galus

(57) ABSTRACT

The present invention relates to a coherent optical transistor device including: first and second coherent optical laser beams from a laser source; wherein the first beam has a relatively higher power/energy than the second beam of at least 2:1; and a permanent sub-wavelength structure in a unitary section into which the first and second beams enter, which permanently modifies a refractive index in both transverse and longitudinal directions; wherein every transverse spatial grating Fourier component in the sub-wavelength structure is phase-shifted by 90 degrees (pi/2) from each of corresponding Fourier components of a spatial interference of the first and second optical beams; and a refractive index profile in the unitary structure in the longitudinal direction is permanently modified, leading to a complete transfer of energy from the first to the second optical beam, resulting in a gain mechanism that results in an amplified signal beam and an inverted signal beam.

21 Claims, 2 Drawing Sheets

(56) References Cited

PUBLICATIONS

Kiyanoosh Goudarzi et al., "All-optical XOR and OR logic gates based on line and point defects in 2-D photonic crystal", Optics & Laser Technology, 2016, pp. 139-142.

Yuanliang Zhang at al., "Optical switches and logic gates based on self-collimated beams in two-dimensional photonic crystals", Optical Society of America, vol. 15, No. 15, 2007.

Deng Pan et al., "Optical interferometric logic gates based on metal slot waveguide network realizing whole fundamental logic operations", Optical Society of America, vol. 21, No. 8, 2013.

COHERENT OPTICAL TRANSISTOR

ORIGIN OF THE INVENTION

The invention described herein was at least in-part made by an employee of the United States Government and may be manufactured or used by or for the Government of the United States of American for governmental purposes without the payment of any royalties thereon or therefor.

BACKGROUND OF THE INVENTION

1. Field of the Invention

The present invention relates to a coherent optical transistor that can provide amplification for either analog or digital optical circuits. In digital optics, it provides a key element in optical logic gates that provide the ability to drive multiple devices using coherent amplification.

2. Description of the Related Art

High speed digital optical logic is important for optical switching for telecommunications, the internet and computing. Most, if not all devices to date, cannot provide restoration of the logic levels or the ability to drive multiple devices (fan-out) without external amplification that relies on stimulated emission, and which introduces spontaneous emission noise. For comparison, a typical Transistor-Transistor-Logic (TTL) gate can provide a fan-out from 2-10. TTL buffer amplifiers can provide a fan-out of 30. Fan-out is vital for complex circuitry, and particularly circuit-board to circuit-board interconnects. Further, conventional high-speed logic devices (for example gallium arsenide, Josephson junctions, and nonlinear optical gates) have limitations due to heat generation.

A universal computing-and-communication objective is to perform switching at very high speeds with very low energy required. The fastest transistors today operate in excess of 500 GHz. The highest reported frequency $f_{max}$ from a gallium arsenide antimony (GaAsSb) based heterojunction bipolar transistor (HBT) is 882 GHz. High speed electronic (transistor) switching is limited by the Power (P) dissipation product: $P=f*V^2*C$—for a Field Effect Transistor (FET) where f is the switching frequency, V is the supply voltage and C is the capacitance, and of course, by the device switching speed. In a bipolar transistor, the Power (P) dissipation product is: $P=i^2*R_L$ or $V^2/R_L$, where "i" is the bipolar transistor output current through the resistive load—$R_L$ and V is the bipolar transistor output voltage across the resistive load—$R_L$.

However, none of the proposed or realized coherent optical logic gate devices show a coherent gain mechanism. Thus, a universal computing and communication objective is a device that can perform switching at very high speeds with very low energy.

SUMMARY OF THE INVENTION

The present invention relates to a coherent optical transistor that can provide amplification for either analog or digital optical circuits. In one embodiment, the present invention relates to a coherent optical logic gate that provides the ability to drive multiple devices using coherent amplification.

Coherent optical logic uses optical interference to realize the basic logic functions. In one embodiment, the coherent transistor (an element of an optical logic gate) of the present invention provides fan-out capability using coherent amplification.

In one embodiment of the present invention, the gain mechanism for the coherent optical transistor is the coherent interaction between the two optical waves (interference) in relation to a unique sub-wavelength structure in the material that causes energy to be transferred from the original direction of the power supply optical beam to the direction of the signal beam. In the present invention, the coherent interaction of the incident two optical beams is with a unique diffraction grating or meta-surface structure. Through this interaction, light from the power supply beam is redirected into the same direction as the signal beam since the beams are coherent, and the result is a larger/higher intensity signal beam.

The coherent transistor of the present invention performs switching at very high speeds (femtosecond) with very low energy required (less than one femtoJoule per switch). For example, the coherent optical transistor of the present invention can operate at switching speeds in excess of 100 THz, which is three orders of magnitude faster than state of the art computers, with almost zero power dissipation (i.e., zero energy).

In one embodiment, a coherent optical transistor device includes: two input coherent pulsed laser beams emitted from at least one laser source, the two input laser beams including a first optical beam and a second optical beam; wherein the first optical beam has a relatively higher power/energy than the second optical beam at a ratio of at least 2:1; and a permanent sub-wavelength structure disposed in a unitary section into which the first optical beam and the optical beam enter; wherein a refractive index is permanently modified in both a transverse direction and a longitudinal direction; and wherein every transverse spatial grating Fourier component in the sub-wavelength structure is phase-shifted by 90 degrees (pi/2) from each of corresponding Fourier components of a spatial interference of the first optical beam and the second optical beam, and a refractive index profile in the unitary structure in the longitudinal direction is permanently modified, leading to a complete transfer of energy from the first optical beam to the second optical beam, and resulting in a gain mechanism that results in an amplified signal beam and an inverted signal beam.

In one embodiment, the at least one laser source is a mode-locked laser.

In one embodiment, the mode-locked laser is a phase-locked mode-locked laser or an optical frequency comb.

In one embodiment, one or both of the two, input coherent laser beams are continuous wave.

In one embodiment, the laser source for the first optical beam is a power supply laser source.

In one embodiment, either or both the pump beam and the signal beam are intensity modulated prior to impinging on the device.

In one embodiment, the pulses of the first optical beam and the second optical beam have a plurality of temporal pulse widths ranging from attoseconds to at least picoseconds and may have a plurality of repetition rates ranging from megahertz to terahertz.

In one embodiment, the first optical beam and the second optical beam are propagated in optical waveguides.

In one embodiment, the optical waveguides are in an integrated photonic circuit, which includes one of a plurality of optical materials including of silicon, silicon nitride, indium phosphide, lithium niobite, silicon dioxide, crystals and glasses.

In one embodiment, one of the plurality of optical materials is silicon nitride.

In one embodiment, the first optical beam and the second optical beam are in free-space and interact in a bulk material.

In one embodiment, the sub-wavelength structure is one of a diffraction grating or volume hologram in a transverse direction, or a meta-structure or meta-surface.

In one embodiment, a transverse refractive index profile and a longitudinal refractive index profile of the sub-wavelength structure, are each custom-designed according to predetermined parameters, including: an optical wavelength, a temporal pulse width and a pulse frequency spectrum, a waveguide material refractive index, a sub-wavelength structure refractive index, a pulse repetition rate, a pulse peak power, a pulse energy, a waveguide geometry (height, width, length, angle and curvature), and an input and output waveguide geometry (height, width, length and angle and curvature).

In one embodiment, the transverse refractive index profile is designed to match a spatial frequency (lines/mm) of an interference pattern formed within said unitary section.

In one embodiment, the sub-wavelength structure refractive index s modified by one of adding dopants, ion implantation, or etching structure.

In one embodiment, the sub-wavelength structure is formed using lithographic techniques.

In one embodiment, switching frequencies of the coherent optical transistor device can be as large as 100 THz or greater, and the device dissipated energy is less than one femtoJoule per switch.

In one embodiment, the first optical beam and the optical signal beam are synchronous.

In one embodiment, the coherent optical transistor device includes a condition where a majority of the power/energy from the first optical beam is transferred to the amplified signal beam to achieve a depleted pump condition, and an opposite condition achieves a non-depleted pump condition.

In one embodiment, either or both the first optical beam and the second optical beam are one of phase modulated, frequency modulated, or polarization modulated prior to impinging on the sub-wavelength structure.

In one embodiment, a method of achieving a gain mechanism for a coherent optical transistor, includes: interfering two input coherent pulsed laser beams emitted from at least one laser source, with a sub-wavelength structure; wherein the two input laser beams include a first optical beam and a second optical beam; wherein the first optical beam has a relatively higher power/energy than the second optical beam at a ratio of at least 2:1; wherein the permanent sub-wavelength structure permanently modifies a refractive index in both a transverse direction and a longitudinal direction; phase-shifting by 90 degrees (pi/2), every transverse spatial grating Fourier component in the sub-wavelength structure from each of corresponding Fourier components of a spatial interference of the first optical beam and the second optical beam; permanently modifying a refractive index profile in the unitary structure in the longitudinal direction, leading to a complete transfer of energy from the first optical beam to the second optical beam, and resulting in a gain mechanism that results in an amplified signal beam and an inverted signal beam.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

The description of the drawing is only one exemplary embodiment of the disclosure and not to be considered as limiting in scope.

DESCRIPTION OF THE INVENTION

The present invention relates to a coherent optical transistor that can provide amplification for either analog or digital optical circuits. In digital optics, it provides a key element in optical logic gates that provide the ability to drive multiple devices using coherent amplification.

The present invention relates to a coherent optical transistor which amplifies a weak optical signal using a strong optical signal. The coherent optical transistor is a building block for complex digital and analog circuits and digital optical and analog optical processors and computers.

Coherent optical logic uses optical interference to realize the basic logic functions. The coherent optical transistor of the present invention uses the same basic principle as an electronic transistor in that a gate controls the flow of energy from a power supply. For the coherent transistor, the gate is typically a low energy/power optical (coherent light) traveling in a unique direction in either free-space or in an optical waveguide. When the gate signal energy/power is present at the same time as the optical power supply signal, energy is transferred (in a predetermined direction) from the power supply signal to the input signal.

In the present invention, the gain is achieved by the coherent interaction of the incident two optical beams with a unique diffraction grating or meta-surface structure. Through this interaction, light from the power supply beam is redirected into the same direction as the signal beam since the beams are coherent, and the result is a larger/higher intensity signal beam.

Although an "optical" device is claimed, as one of ordinary skill in the art would contemplate, the same device can be built in other regions of the electromagnetic spectrum including, microwave, THz, and X-ray, etc.

Figure 1:
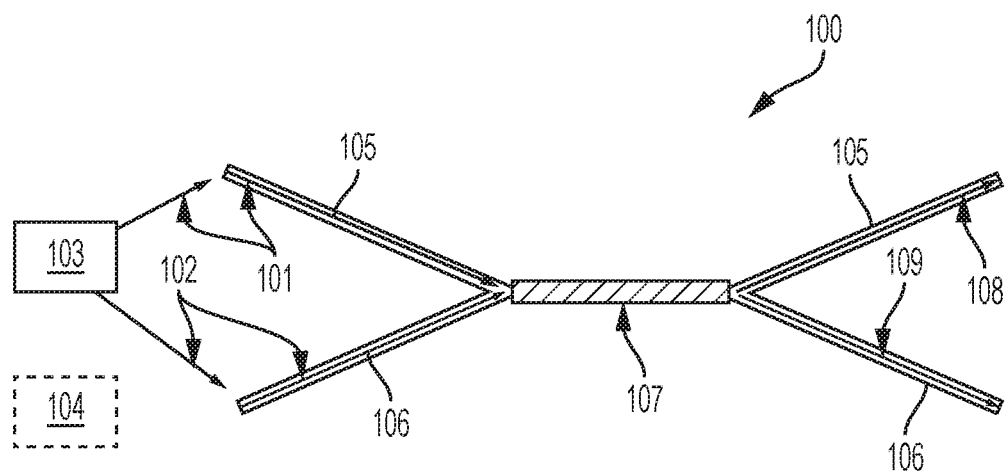
FIG. 1 depicts a schematic diagram of a coherent optical transistor according to one embodiment consistent with the present invention.

In one embodiment, the coherent optical transistor 100 (see FIG. 1), includes two input coherent pulsed laser beams 101, 102, one beam 101 which is typically higher power/energy (i.e., the "optical 'power supply' beam") than the other beam 102 (i.e., the "signal beam"). In one embodiment, either or both of the two laser beams 101, 102 may be continuous wave.

In one embodiment, the higher power/energy device 103 may be referred to as the power supply or source 103. In one embodiment, the weaker power/energy device is also from source 103, or from a second source 104. If from two sources 103, 104, the second source 104 must be in synchronization, or frequency locked, with the power supply and clock of the first source 103. In one embodiment, the higher power/energy laser beam 101 may be typically greater than 2:1 and could be as high as 1000:1 or greater in ratio to the lower power/energy laser beam 102.

In one embodiment, the input coherent pulsed laser beams 101, 102 are typically derived from a source 103 such as a mode-locked laser (i.e., laser diode), and for high clock rates (i.e., more than 10 GHz), from a phase-locked mode-locked laser typically known as an optical frequency comb.

In one embodiment, the optical frequency comb light source 103 is the most suitable to demonstrate the coherent transistor operation. Femtosecond pulses for the comb source 103 are used to generate both the optical power supply beam 101 and the optical gate signal 102. The optical path delays in the system must be adjusted such that the optical signal and power supply signal beams 102, 101 will be synchronous (to much less than the comb pulse width) at the coherent optical transistor locations.

In one embodiment, the pulses of the laser beams 101, 102 can have a variety of temporal pulse widths ranging from attoseconds to picoseconds or longer and may have a variety of repetition rates ranging from megahertz to terahertz.

In one embodiment, the two input laser beams 101, 102 are typically propagating in optical waveguides 105, 106. In one embodiment, the optical waveguide 105, 106 has permanent sub-wavelength (i.e., optical wavelength is typically 1550 nm) structures 107 in a unitary section of the optical waveguide (see FIG. 1) to permanently modify the refractive index in both the transverse and longitudinal directions. Sub-wavelength typically means structures 107 ranging from 1/1000 to 1/10 of a wavelength. However, the sub-wavelength structures 107 may be modulated with external (or internal) electric, magnetic fields, and/or temperature (not shown).

In one embodiment, the two input laser beams 101, 102 are typically propagating in optical waveguides 105, 106 in an integrated photonic circuit. However, in other embodiments, the two input laser beams 101, 102 can be in free-space and interact in a bulk material.

In one embodiment, a diffractive photonic crystal used in the integrated photonic circuit can include a wide variety of optical materials including silicon, indium phosphide, lithium niobite, silicon dioxide, crystals and glasses. In one exemplary embodiment, a typical material with low propagation loss is $Si_3N_4$ (silicon nitride).

In one embodiment, the transverse sub-wavelength structures 107 are similar to diffraction gratings (i.e., volume holograms, or volume diffraction gratings) in the transverse direction, but may also be high-index-contrast dielectric (or conductive) meta-structures or meta-surfaces. In one embodiment, instead of a dynamic grating being temporarily written in a photorefractive crystal, it is fabricated permanently in an integrated photonic circuit or a photonic crystal.

Figure 2:
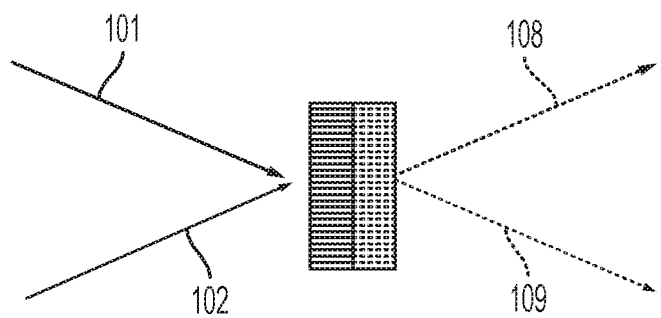
FIG. 2 depicts a schematic diagram of an interference pattern and transverse refractive index ($\Delta n$) profile of the coherent optical transistor, according to one embodiment consistent with the present invention.

An important principle for the diffraction-based coherent transistor 100 of the present invention is that every transverse spatial grating Fourier component in the sub-wavelength structure 107 (of the coherent transistor) is phase-shifted by 90 degrees (pi/2) from each of the corresponding Fourier components of the spatial interference of the signal beam 102 and power supply beam 101 (see FIG. 2), exiting the unitary sub-wavelength structure 107. This condition (i.e., the 90-degree phase shift) can lead to a full transfer of all of the energy in the power supply beam 101 to the signal beam 102 in a volume (3-dimensional) diffraction grating or photonic crystal structure. This gain mechanism that results in outputs 108, 106 that include a non-inverted or amplified signal beam 108 and an inverted signal beam 109 is a linear effect and requires no optical nonlinearity in the coherent transistor material. Thus, the refractive index profile in the longitudinal direction is permanently modified in the structure 107 to optimize the energy transfer from the power supply beam 101 to the signal beam 102. The only thermal energy at the coherent transistor is a small amount caused by absorption which can be greatly minimized via choice of material for specific wavelengths.

In one embodiment, the transverse sub-wavelength structure 107 (i.e., the transverse refractive index profile) is custom-designed according to the predetermined parameters, including: the optical wavelength, the temporal pulse width (and by implication the pulse frequency spectrum), the waveguide material refractive index, the sub-wavelength structure refractive index, the pulse repetition rate, the pulse peak power, the pulse energy, waveguide geometry (height, width, length, angle and curvature), input and output waveguide geometry (height, width, length and angle and curvature).

In one embodiment, the transverse refractive index profile is designed to match the spatial frequency (lines/mm) of the interference pattern formed within the waveguide 105, 106 by the two, input coherent pulsed laser beams 101, 102.

Figure 3:
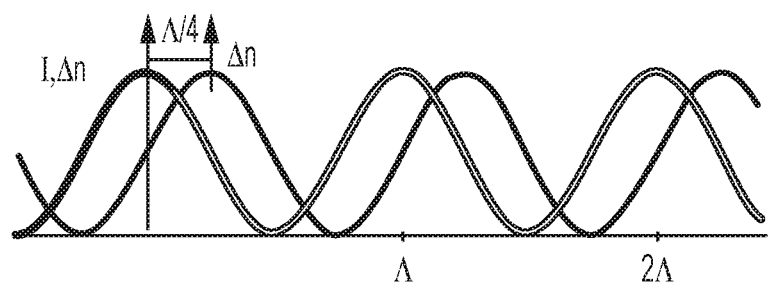
FIG. 3 depicts a graph for one of the Fourier components of the interference pattern optical intensity I, transverse refractive index ($\Delta n$) profile, grating period ($\Lambda$) with pi/2=90 degree=$\Lambda$/4 phase shift, of the coherent optical transistor, according to one embodiment consistent with the present invention.

In one embodiment, the transverse refractive index profile is designed to be shifted in phase relative to the interference pattern formed within the waveguide by the two, input coherent pulsed laser beams 101, 102 (see FIG. 3). The component of the refractive-index grating shifted by pi/2 (or 90 degrees) with respect to the interference pattern, yields the energy transfer between the strong beam 101 and the weak beam 102.

In one embodiment, the longitudinal refractive index profile is custom-designed to maximize the energy transfer from the strong beam 101 to the weak beam 102 using the following parameters: the optical wavelength, the temporal pulse width (and by implication the pulse frequency spectrum), the waveguide material refractive index, the sub-wavelength structure refractive index, the pulse repetition rate, the pulse peak power, the pulse energy, waveguide geometry (height, width, length, angle and curvature), input and output waveguide geometry (height, width, length and angle and curvature).

Figure 4:
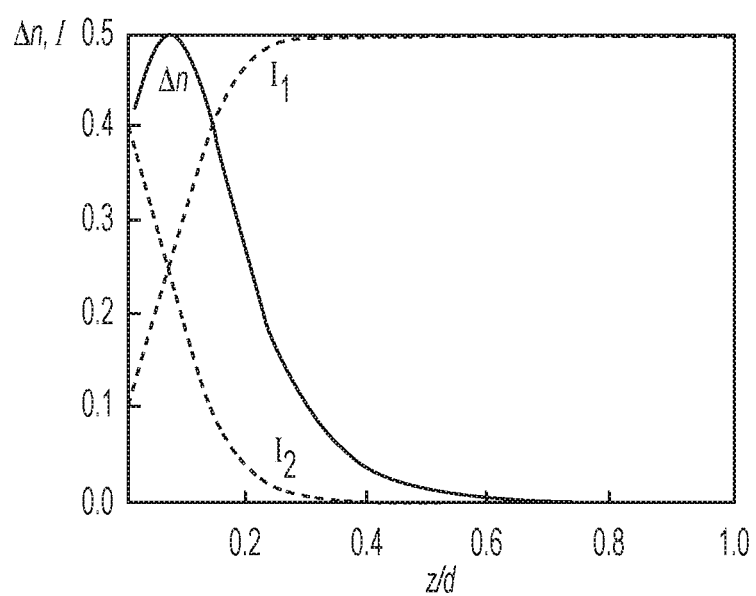
FIG. 4 depicts a graph of an example of the longitudinal refractive index ($\Delta n$) profile, and strong ($I_2$) and weak ($I_1$) beam intensities (for 4:1 input ratio of strong to weak beams), with z=distance and d=device length, according to one embodiment consistent with the present invention.

FIG. 4 shows an example of the longitudinal refractive index ($\Delta n$) profile, and strong ($I_2$) and weak ($I_1$) beam intensities (for 4:1 input ratio of strong to weak beams), with z=distance and d=grating period.

In one embodiment, the coherent optical transistor transfers energy from the strong optical beam 101 to the strong optical signal 102 via the sub-wavelength structures 107 (e.g., diffraction gratings and longitudinal refractive index ($\Delta n$) profile). Thus, the intent of the present invention is to amplify (or attenuate) and/or switch (or modulate) the weak and strong optical beams 102, 101, respectively, at very short time scales (i.e., attoseconds to picoseconds or longer) with extremely low dissipation energy (i.e., approaching zero—or, less than femtojoules).

In one embodiment, only a small fraction of the energy in the pump beam 101 (i.e., <10%) is transferred to the signal output beam 108. This is known as the non-depleted pump condition.

In one embodiment, a large fraction of the energy in the pump beam 101 (i.e., >10%) is transferred to the signal output beam 108. This is known as the depleted pump condition.

In one embodiment, either or both the pump beam 101 and the signal beam 102 are phase modulated prior to impinging on the structure 107 of the coherent transistor device 100.

In one embodiment, either or both the pump beam 101 and the signal beam 102 are frequency modulated prior to impinging on the structure 107 of the coherent transistor device 100.

In one embodiment, either or both the pump beam 101 and the signal beam 102 are polarization modulated prior to impinging on the structure 107 of the coherent transistor device 100.

There are wide variety of methods to modify the refractive index at the sub-wavelength level. Three typical methods include: 1) adding dopants; 2) ion implantation; and 3) etching structures. In one embodiment, the sub-wavelength structures 107 are typically formed using lithographic techniques. With the advent of integrated photonics and nano-materials, the structures 107 of the present invention can be custom-designed using computer-aided design tools (e.g. FullWAVE, BandSOLVE and FemSIM by RSoft).

As described above, the coherent transistor 100 (optical logic gate) of the present invention provides fan-out capability using coherent amplification. The coherent transistor 100 of the present invention performs switching at very high speeds (femtosecond) with very low energy required (less than one femtoJoule per switch). For example, the coherent optical transistor 100 of the present invention can operate at switching speeds in excess of 100 THz with almost zero power dissipation (i.e., zero energy), which is three orders of magnitude faster than state of the art computers. wherein switching frequencies of the coherent optical transistor device are 100 THz or greater, and an energy dissipated of the coherent optical transistor device is less than one femtoJoule per switch.

In the present invention, the gain mechanism for the coherent optical transistor 100 is the coherent interaction between the two optical waves (interference) in relation to a unique sub-wavelength structure 107 in the material that causes energy to be transferred from the original direction of the power supply optical beam 101 to the direction of the signal beam 102. Accordingly, the gain is achieved by the coherent interaction of the incident two optical beams 101, 102 with the unique diffraction grating 107 or meta-surface structure 107. Through this interaction, light from the power supply beam 101 is redirected into the same direction as the signal beam 102 since the beams 101, 102 are coherent, and the result is a larger/higher intensity amplified signal beam 108.

The coherent optical transistor of the present invention has enormous commercial value for computing etc., due to its switching speeds and almost zero power dissipation. This provides a viable path to computers that are at least three orders of magnitude faster than the world's fastest computers and provides a viable gain mechanism not present in previous coherent transistors.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A coherent optical transistor device comprising:
   two input coherent pulsed laser beams emitted from at least one laser source, said two input laser beams including a first optical beam and a second optical beam;
   wherein said first optical beam has a relatively higher power/energy than said second optical beam at a ratio of at least 2:1; and
   a permanent sub-wavelength structure disposed in a unitary section into which said first optical beam and said optical beam enter;
   wherein a refractive index is permanently modified in both a transverse direction and a longitudinal direction whereby the transverse direction and longitudinal direction are arranged at a 90 degree angle with respect to each other; and
   wherein every transverse spatial grating Fourier component in said sub-wavelength structure is phase-shifted by 90 degrees (pi/2) from each of corresponding Fourier components of a spatial interference of said first optical beam and said second optical beam, and a refractive index profile in said unitary structure in said longitudinal direction is permanently modified, leading to a complete transfer of energy from said first optical beam to said second optical beam, and resulting in a gain mechanism that results in an amplified signal beam and an inverted signal beam.

2. The coherent optical transistor device of claim 1, wherein said at least one laser source is a mode-locked laser.

3. The coherent optical transistor device of claim 2, wherein said mode-locked laser is a phase-locked mode-locked laser or an optical frequency comb.

4. The coherent optical transistor device of claim 1, wherein said laser source for said first optical beam is a power supply laser source.

5. The coherent optical transistor device of claim 3, wherein pulses of said first optical beam and said second optical beam have a plurality of temporal pulse widths ranging from attoseconds to at least picoseconds and may have a plurality of repetition rates ranging from megahertz to terahertz.

6. The coherent optical transistor device of claim 1, wherein said first optical beam and said second optical beam are propagated in optical waveguides.

7. The coherent optical transistor device of claim 6, wherein said optical waveguides are in an integrated photonic circuit, which includes one of a plurality of optical materials including of silicon, silicon nitride, indium phosphide, lithium niobite, silicon dioxide, crystals and glasses.

8. The coherent optical transistor device of claim 7, wherein said one of said plurality of optical materials is silicon nitride.

9. The coherent optical transistor device of claim 1, wherein said first optical beam and said second optical beam are in free-space and interact in a bulk material.

10. The coherent optical transistor device of claim 1, wherein said sub-wavelength structure is one of a diffraction grating or volume hologram in said transverse direction, or a meta-structure or meta-surface.

11. The coherent optical transistor device of claim 1, wherein a transverse refractive index profile and a longitudinal refractive index profile of said sub-wavelength structure, are each custom-designed according to predetermined parameters, including: an optical wavelength, a temporal pulse width and a pulse frequency spectrum, a waveguide material refractive index, a sub-wavelength structure refractive index, a pulse repetition rate, a pulse peak power, a pulse energy, a waveguide geometry (height, width, length, angle and curvature), and an input and output waveguide geometry (height, width, length and angle and curvature).

12. The coherent optical transistor device of claim 11, wherein said transverse refractive index profile is designed to match a spatial frequency (lines/mm) of an interference pattern formed within said unitary section.

13. The coherent optical transistor device of claim 11, wherein said sub-wavelength structure refractive index is modified by one of adding dopants, ion implantation, or etching structure.

14. The coherent optical transistor device of claim 13, wherein said sub-wavelength structure is formed using lithographic techniques.

15. The coherent optical transistor device of claim 1, wherein switching frequencies of the coherent optical transistor device are 100 THz or greater, and an energy dissipated of the coherent optical transistor device is less than one femtoJoule per switch.

16. The coherent optical transistor device of claim 2, wherein said first optical beam and said optical signal beam are synchronous.

17. The coherent optical transistor device of claim 1, wherein either or both said first optical beam and said second optical beam are one of phase modulated, frequency modulated, or polarization modulated prior to impinging on said sub-wavelength structure.

18. A method of achieving a gain mechanism for a coherent optical transistor device, comprising:
  interfering two input coherent pulsed laser beams emitted from at least one laser source, with a sub-wavelength structure;
  wherein said two input laser beams include a first optical beam and a second optical beam;
  wherein said first optical beam has a relatively higher power/energy than said second optical beam at a ratio of at least 2:1;
  wherein said permanent sub-wavelength structure permanently modifies a refractive index in both a transverse direction and a longitudinal direction; whereby the transverse direction and longitudinal direction are arranged at a 90 degree angle with respect to each other;
  phase-shifting by 90 degrees (pi/2), every transverse spatial grating Fourier component in said sub-wavelength structure from each of corresponding Fourier components of a spatial interference of said first optical beam and said second optical beam; and
  permanently modifying a refractive index profile in said unitary structure in said longitudinal direction, leading to a complete transfer of energy from said first optical beam to said second optical beam, and resulting in a gain mechanism that results in an amplified signal beam and an inverted signal beam.

19. The method of claim 18, wherein said first optical beam and said second optical beam are propagated in optical waveguides.

20. The method of claim 18, wherein said sub-wavelength structure is one of an integrated photonic circuit, a diffraction grating or volume hologram in a transverse direction, or a meta-structure or meta-surface.

21. The method of claim 18, wherein switching frequencies of the coherent optical transistor device are 100 THz or greater, and an energy dissipated of the coherent optical transistor device is less than one femtoJoule per switch.

* * * * *